United States Patent [19]

Congdon

[11] 4,263,563

[45] Apr. 21, 1981

[54] AMPLIFIER OUTPUT STAGE DISTORTION REDUCTION

[75] Inventor: James S. Congdon, Santa Clara, Calif.

[73] Assignee: National Semiconductor Corporation, Santa Clara, Calif.

[21] Appl. No.: 56,489

[22] Filed: Jul. 11, 1979

[51] Int. Cl.³ .......................... H03F 3/26; H03F 3/45
[52] U.S. Cl. ..................................... 330/265; 330/255
[58] Field of Search ................................ 330/265, 255

[56] References Cited

U.S. PATENT DOCUMENTS

| | | | |
|---|---|---|---|
| 3,526,846 | 9/1970 | Campbell | 330/265 |
| 3,631,357 | 12/1971 | Hadley | 330/265 |
| 3,638,130 | 1/1972 | Freeborn | 330/255 |

FOREIGN PATENT DOCUMENTS 1202461  8/1970  United Kingdom ..................... 330/265

OTHER PUBLICATIONS

"Designing Transistor AF Power Amplifiers" by Herscher Electronics, (Engineering Edition), Apr. 11, 1968, pp. 96-99.

*Primary Examiner*—Harold A. Dixon
*Attorney, Agent, or Firm*—Gail W. Woodward; James A. Sheridan

[57] ABSTRACT

A high power integrated circuit amplifier employs emitter ballasted NPN output transistors. One output transistor is driven by a PNP transistor to create a composite pair. Since the ballast resistor, in the composite pair, is effectively in the collector of a PNP equivalent transistor, the output stage creates substantial distortion. The output stage is driven by a conventional high gain capacitance compensated amplifier. By connecting an additional negative feedback capacitor between the emitter of the composite pair output transistor and the driver amplifier input, the distortion can be effectively compensated without resorting to power dissipative distortion reduction.

6 Claims, 4 Drawing Figures

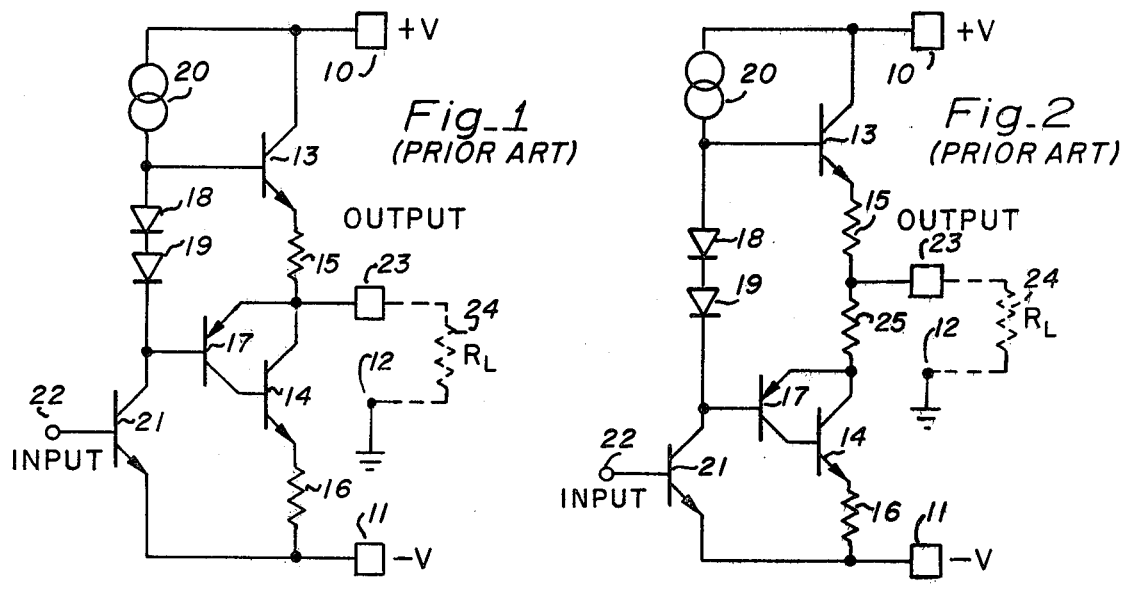
*Fig_1* (PRIOR ART)
*Fig_2* (PRIOR ART)
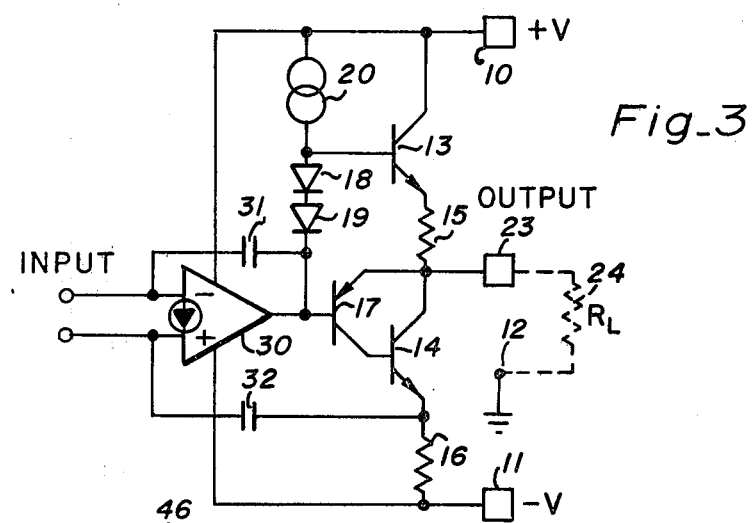
*Fig_3*
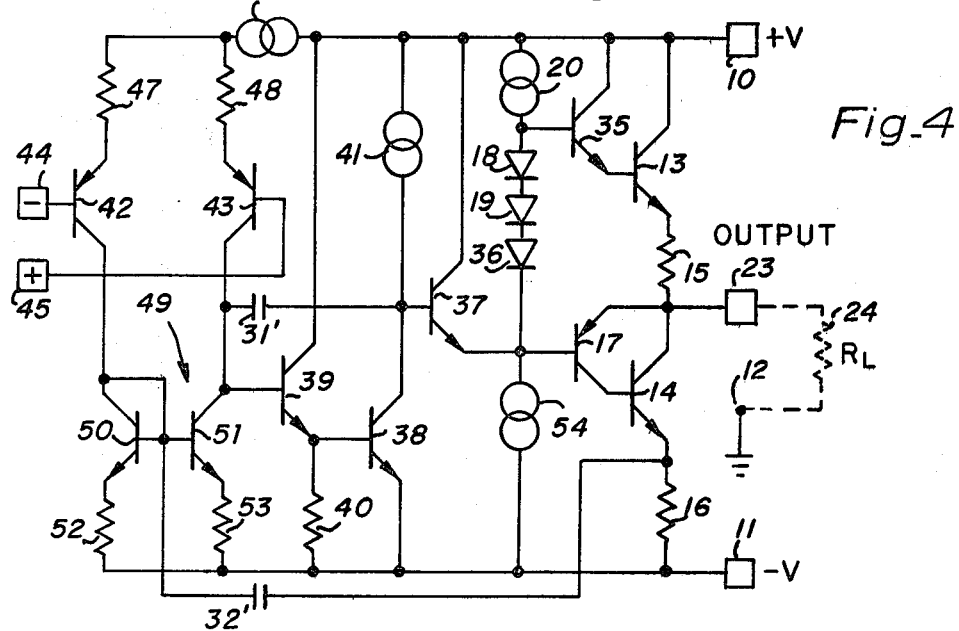
*Fig_4*

AMPLIFIER OUTPUT STAGE DISTORTION REDUCTION

BACKGROUND OF THE INVENTION

Monolithic semiconductor integrated circuit technology has produced a revolution in electronic circuit design and performance. However, the output power normally delivered by such circuits, is quite low. While from thermal and packaging considerations, high wattage amplifiers should be feasible, most single chip integrated circuit (IC) devices will at best deliver a few watts. This is ordinarily inadequate to meet the requirements of much of the audio device markets and in particular, the so-called high fidelity markets.

It is not too difficult to build power transistors into an IC chip and to dissipate the power needed to develop a 20 watt output. However, the IC design constraints have ordinarily resulted in reduced efficiency or unacceptably high distortion in the higher power devices. Thus, there appears to be a tradeoff between power output and efficiency or distortion that has prevented the development of suitable devices.

SUMMARY OF THE INVENTION

It is an object of the invention to provide a high power IC amplifier that has low distortion.

It is a further object of the invention to provide internal compensation in an IC amplifier which acts to reduce distortion at high power output.

These and other objects are achieved by employing a conventional class B output stage in an IC chip. The output transistors are of NPN plural emitter ballasted contruction. One of the output transistors is driven by a PNP transistor to create a composite pair. The output stage is driven by a high gain Miller capacitance compensated driver. An additional feedback capacitor is coupled from the ballast resistor in the emitter of the composite pair, which acts as the current sinking output transistor, to the input of the output stage driver. This feedback loop is degenerative and acts to compensate the distortion contributed by the imbalance between the output sourcing and sinking transistors. It is this imbalance that contributes most of the distortion normally found in such high power output stages.

BRIEF DESCRIPTION OF THE DRAWING

FIG. 1 is a schematic diagram of a typical prior art IC output stage;

FIG. 2 is a schematic diagram of the prior art means for reducing output stage distortion;

FIG. 3 is a combination schematic-block diagram showing the circuit of the invention; and FIG. 4 is a schematic diagram of a high power low distortion IC amplifier.

DESCRIPTION OF THE PRIOR ART

FIG. 1 shows a typical IC class B power output stage. In this drawing and subsequent ones, the square elements represent IC chip pads which comprise externally available connections. External parts are shown with dashed lines. The stage operates from a split power supply which supplies equal positive and negative voltages respectively, to terminals 10 and 11 referenced to ground at 12. NPN transistors 13 and 14 are high dissipation devices using multiple emitter construction. Resistors 15 and 16 are actually ballast resistors and each one consists of a plurality of individual resistance elements interconnecting all of the individual emitter segments to a common emitter terminal. These resistors are, in practice, an integral part of the power transistor construction and operate to equalize the individual emitter segment currents.

PNP transistor 17 acts with transistor 14 to create what is known as a composite pair. While power transistor 14 is of NPN construction, the composite pair acts as if it were a PNP device which complements transistor 13.

Diodes 18 and 19 are forward biased by current source 20 so that the bases of transistors 13 and 17 are coupled together with a two diode offset that substantially eliminates crossover distortion and provides class B operating bias. Transistor 21 drives transistors 13 and 17 in the same phase from input terminal 22. The d-c bias on transistor 21 is commonly set so that for no signal conditions, the voltage at the collector of transistor 14 is at ground potential. This means that a load resistance 24 ($R_L$) can be coupled between output terminal 23 and ground 12 without requiring a blocking capacitor. This makes the circuit fully, directly coupled.

The circuit of FIG. 1 will provide an IC output stage capable of operating at relatively high power. However, there is one serious flaw. When transistor 13 is sourcing curent to load resistor 24, ballast resistor 15 acts as a series emitter resistance and thereby degenerates the emitter follower action. When transistor 14 is sinking current from load resistor 24, due to the action of transistor 17, the collector of transistor 14 is actually the emitter of the equivalent PNP device. Since there is no emitter degeneration resistor, the output will more closely follow the input and will therefore be higher. The physical resistor 16 actually appears in the collector of the PNP equivalent and will therefore have no degenerative effect. The result of this action is to produce output signal swings that are greater for negative output swings than for positive output swings. This manifests itself as harmonic distortion of the input signal.

FIG. 2 shows a commonly accepted means for reducing such distortion. Resistor 25 is connected between output terminal 23 and the collector of transistor 14. Thus, resistor 25 acts as a ballast element in the effective emitter circuit of the composite pair. If resistor 25 is made equal to resistor 15, the composite pair gain is degenerated to more closely match the performance of transistor 13.

While the circuit of FIG. 2 provides the desired low distortion, it compromises power output. Clearly, all of the sinking current must flow in the resistor, which is dissipative. This also adds a series voltage drop and reduces the output signal swing capability and hence power output.

DESCRIPTION OF THE INVENTION

FIG. 3 shows the basic circuit of the invention. Where the parts are equivalent to FIG. 1, similar designations are used. The output stage is like that of FIG. 1. However, an operational amplifier (op amp) is shown as the output driver. Op amp 30 has high gain and a differential input. As is typical in IC design a compensation capacitor 31 provides negative feedback around the amplifier thus creating a 6 db per octave gain roll-off with frequency. This circuit configuration converts op amp 30 into a current source driver for transistors 13 and 17 as indicated by the symbol.

It will be noted that transistor 17 acts as an inverter on signals at the output of op amp 30. This means that the signal components across resistor 16 are out of phase with respect to the signal polarity at the noninverting input of op amp 30. Thus, capacitor 32, which is connected between the emitter of transistor 14 and the noninverting input to op amp 30, acts as a negative feedback element within the amplifier, but is active only when the sinking transistor 14 is on. Thus, the amplifier gain is degenerated for the signal condition that would normally result in excessive gain in the circuit of FIG. 1, but the correction is nondissipative. Additionally capacitor 32 is desirably made equal to capacitor 31. Thus, the harmonic distortion is cancelled in a nondissipative manner and does not detract from the output signal swing and power output. This is achieved by merely adding a single, small capacitor to the conventional, internal frequency compensation arrangement.

FIG. 4 shows a practical way of constructing an IC in accordance with the invention. Where the parts correspond to those of FIGS. 1 and 3, similar designations are used. In particular, the elements in differential op amp 30 are further detailed.

Output transistor 13 is driven by emitter follower 35. Since this offsets the bases of transistors 35 and 17 by three diodes, a three diode bias offset is employed in the form of diodes 18, 19, and 36 which are forward biased by current source 20. The output stage is driven from emitter follower 37 which includes current source 54 as a load. This output stage-driver configuration results in a relatively high impedance looking into the base of transistor 37, yet provides a suitably high base, current drive capability for the output transistors.

Common emitter transistor 38 is a high gain, inverting stage and is driven from emitter follower 39. Current source 41 provides the collector current for transistor 38. Compensation capacitor 31' provides negative feedback so that the gain rolls off with frequency at the desired 6 db per octave. Since this feedback is capacitive, the Miller effect produces a large effective shunt capacitance from the base of transistor 39 to ground. This means that the high gain stage has a very low input impedance and is thus a current responsive device. Resistor 40 constitutes the load for transistor 39.

Transistors 42 and 43 are connected in a conventional differential amplifier configuration and are coupled respectively to input terminals 44 and 45. These are inverting (−) and noninverting (+) with respect to output terminal 23. Current source 46 provides the input stage tail current and resistors 47 and 48 degenerate the emitters to linearize the operation of transistors 42 and 43.

The input stage includes a current mirror load 49 which comprises transistors 50 and 51 along with balanced noise reducing resistors 52 and 53. This current mirror converts the differential input stage to a single ended output which is directly connected to the base of transistor 39.

The distortion compensating feedback capacitor 32' is connected between the emitter of transistor 14 and the base of transistor 51 in current mirror 49. Since signal inversions are present in transistors 17, 38, and 51, capacitor 32' is in a negative feedback loop which acts to roll off the circuit gain an additional increment for output signal swings that result from turning transistor 14 on. Thus, while compensation capacitor 31' is active for both signal polarities, an additional compensation increment is present for negative output signal swings. This increment is responsible for avoiding the distortion present in the circuit of FIG. 1.

EXAMPLE

The circuit of FIG. 4 was fabricated using conventional IC parts. The NPN transistors were conventional vertical double diffused devices. Output transistors 13 and 14 employed multiple emitter ballasted construction, each one having 144 emitter elements. The PNP transistors were of conventional high current gain lateral construction. The capacitors were equivalent to conventional oxide dielectric capacitors. The following component values were employed.

| Component | Value | Units |
|---|---|---|
| Resistor 15 | 0.15 | ohms |
| Resistor 16 | 0.15 | ohms |
| Source 20 | 2.7 | milliamperes |
| Capacitor 31' | 4 | picofarads |
| Capacitor 32' | 4 | picofarads |
| Source 54 | 7.5 | milliamperes |
| Resistor 40 | 15 | K ohms |
| Source 41 | 400 | microamperes |
| Source 46 | 60 | microamperes |
| Resistor 47 | 3.3 | K ohms |
| Resistor 48 | 3.3 | K ohms |
| Resistor 52 | 6.8 | K ohms |
| Resistor 53 | 6.8 | K ohms |

The amplifier had an open loop gain of about 80 db. With an 8 ohm load resistor 24 and a ±22 volt power supply, it produced a 20 watt output with an open loop Total Harmonic Distortion (THD), measured at 20 KHz of only 0.15%. With capacitor 32' disconnected, the THD was 1.5%. This shows a very significant distortion reduction in the open loop configuration using the invention. When the amplifier with capacitor 32 in place included a feedback resistor network coupled between terminals 23 and 44 and selected to produce a closed loop gain of 26 db, the THD was less than 0.03% at 20 watts output. With the feedback resistor network in place but with capacitor 32'. disconnected, the distortion was about 0.02%. This shows that even in the closed loop configuration with considerable negative feedback use of the invention still results in a dramatic reduction of distortion without loss of efficiency, reducing power output, or lower signal swing.

The invention has been described and its effect upon the performance of a practical amplifier detailed. Clearly there are alternatives and equivalents that are within the spirit and intent of the invention. For example, while the invention is primarily intended for use in monolithic integrated circuits, it could be used in hybrid or discrete component circuits. The invention will be of use whenever a class B transistor output stage employs the same conductivity type transistors with ballasting and a complementary driver coupled to one output transistor to create a composite pair. Accordingly, it is intended that the scope of the invention be limited only by the claims that follow.

I claim:
1. An amplifier circuit comprising:
   an output stage including at least a pair of like conductivity type emitter ballasted power transistors coupled in series between positive and negative power supply terminals;
   means for coupled to one of said power transistors to create a composite pair;

means for biasing said output transistors to approximate class B operation;

amplifier stage means including a frequency compensation capacitor for driving said output transistors; and negative feedback means including a distortion compensation capacitor coupled between said composite pair and said amplifier means whereby the distortion created in said output transistors is compensated.

2. The amplifier of claim 1 wherein said distortion compensation capacitor is connected to the emitter of said power transistor in said composite pair.

3. The amplifier of claim 2 wherein said distortion compensation capacitor is selected to cause said negative feedback means to match said frequency compensation.

4. In an integrated circuit comprising:

a pair of large area transistors of a first conductivity type employing plural emitter construction and emitter resistor ballasting;

means for coupling said large area transistors in series between positive and negative supply rails;

a complementary conductivity type transistor coupled to one of said large area transistors to create a composite pair therewith;

means for biasing said large area transistors to produce substantially class B operation capability; and driver stage means for coupling signals to said large area transistors; the improvement comprising:

negative feedback means including a capacitor coupled between said composite pair and said driver stage to compensate the distortion generated in said large area transistors.

5. The improvement of claim 4 wherein said driver stage includes a frequency compensation capacitor and said feedback capacitor is selected to cause said negative feedback to match said frequency compensation.

6. The improvement of claim 4 wherein said feedback capacitor is connected to the emitter of said large area transistor in said composite pair.

* * * * *